(12) United States Patent
Yamada

(10) Patent No.: US 10,355,090 B2
(45) Date of Patent: Jul. 16, 2019

(54) SILICON CARBIDE SEMICONDUCTOR DEVICE

(71) Applicant: FUJI ELECTRIC CO., LTD., Kawasaki-shi, Kanagawa (JP)

(72) Inventor: Shoji Yamada, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/022,589

(22) Filed: Jun. 28, 2018

(65) Prior Publication Data

US 2018/0308939 A1    Oct. 25, 2018

Related U.S. Application Data

(63) Continuation of application No. PCT/JP2017/021394, filed on Jun. 8, 2017.

(30) Foreign Application Priority Data

Jul. 15, 2016 (JP) ................. 2016-140795

(51) Int. Cl.
*H01L 29/16* (2006.01)
*H01L 29/739* (2006.01)
(Continued)

(52) U.S. Cl.
CPC ...... *H01L 29/1608* (2013.01); *H01L 29/0615* (2013.01); *H01L 29/0619* (2013.01);
(Continued)

(58) Field of Classification Search
None
See application file for complete search history.

(56) References Cited

U.S. PATENT DOCUMENTS 7,737,469 B2 *   6/2010   Saito .................... H01L 29/872
                                                                  257/197
9,202,940 B2 *  12/2015   Kawakami .......... H01L 29/8611
                         (Continued)

FOREIGN PATENT DOCUMENTS

JP           5554415 B2      7/2014
JP           5600698 B2     10/2014
                         (Continued)

*Primary Examiner* — Michelle Mandala
(74) *Attorney, Agent, or Firm* — Rabin & Berdo P.C.

(57) ABSTRACT

In an edge termination region, first to third electric field mitigating layers are provided in a concentric shape surrounding an active region. Between adjacent first to third electric field mitigating layers, p-type first to third space-modulated regions are provided each of which is closer to a chip edge than is the third electric field mitigating layer. Each of the space-modulated regions is formed by, from an inner side, a low-concentration sub-region and a high-concentration sub-region arranged to alternately repeat in a concentric shape surrounding the electric field mitigating layer on the inner side. Preferable, lengths (Lb1, Lb2, Lb3) of the first to third space-modulated regions are set to satisfy Lb1≤Lb2<Lb3 and preferably lengths (La1, La2, La3) of the first to third electric field mitigating layers are set to satisfy La1<La2<La3. A rate of increase of the lengths of the first to third electric field mitigating layers may be constant.

10 Claims, 11 Drawing Sheets

(51) Int. Cl.
  *H01L 29/872* (2006.01)
  *H01L 29/12* (2006.01)
  *H01L 29/06* (2006.01)
  *H01L 29/10* (2006.01)
  *H01L 29/78* (2006.01)

(52) U.S. Cl.
  CPC .......... *H01L 29/1095* (2013.01); *H01L 29/12* (2013.01); *H01L 29/739* (2013.01); *H01L 29/7823* (2013.01); *H01L 29/872* (2013.01)

(56) References Cited

U.S. PATENT DOCUMENTS

| | | | |
|---|---|---|---|
| 2011/0204469 A1* | 8/2011 | Onishi | H01L 29/0619 257/490 |
| 2012/0126315 A1* | 5/2012 | Onishi | H01L 29/0634 257/329 |
| 2013/0140582 A1 | 6/2013 | Kawakami et al. | |
| 2014/0353678 A1 | 12/2014 | Kawakami et al. | |
| 2016/0005810 A1 | 1/2016 | Mochizuki et al. | |
| 2016/0218187 A1 | 7/2016 | Mochizuki et al. | |
| 2017/0084701 A1 | 3/2017 | Kitamura | |

FOREIGN PATENT DOCUMENTS

| WO | WO-2013/136550 A1 | 9/2013 |
|---|---|---|
| WO | WO-2014/045480 A1 | 3/2014 |
| WO | WO-2014/136344 A1 | 9/2014 |
| WO | WO-2015/033463 A1 | 3/2015 |
| WO | WO-2016/103814 A1 | 6/2016 |

\* cited by examiner

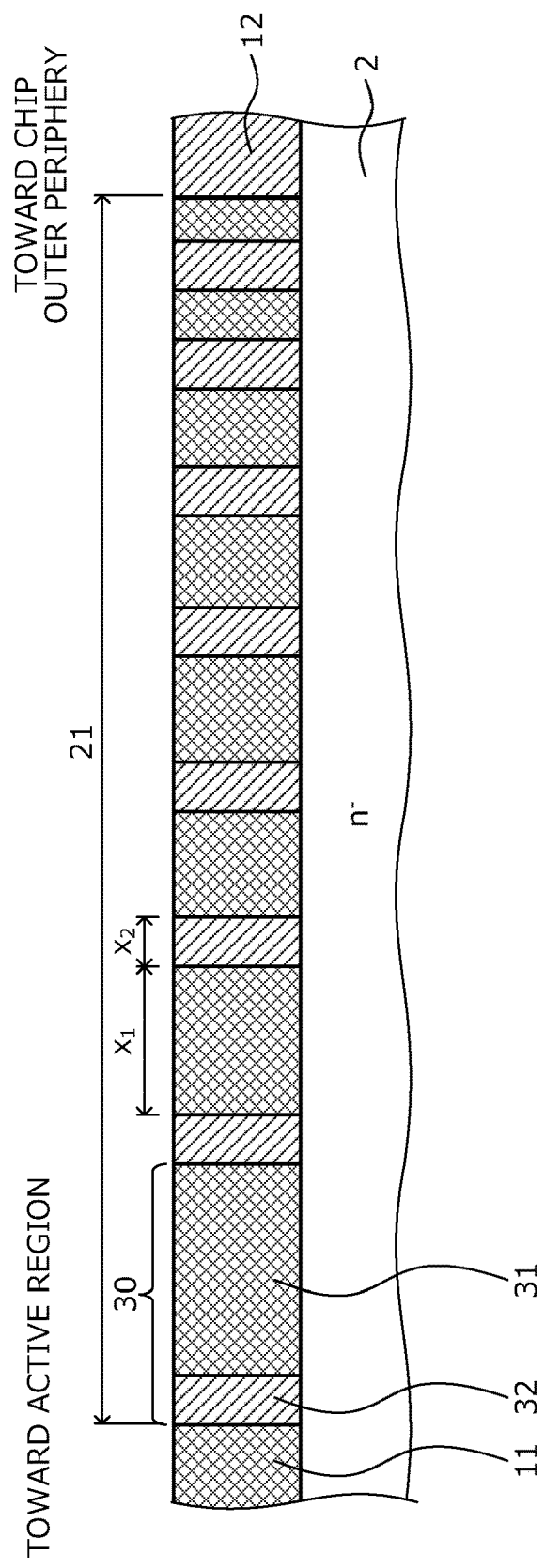

SILICON CARBIDE SEMICONDUCTOR DEVICE

CROSS REFERENCE TO RELATED APPLICATIONS

This is a continuation application of International Application PCT/JP2017/021394 filed on Jun. 8, 2017, which claims priority from a Japanese Patent Application No. 2016-140795 filed on Jul. 15, 2016, the contents of which are incorporated herein by reference.

BACKGROUND OF THE INVENTION

1. Field of the Invention

Embodiments of the invention relate to a silicon carbide semiconductor device.

2. Description of the Related Art

In semiconductor devices (hereinafter, silicon carbide semiconductor devices) using a silicon carbide (SiC) semiconductor material, formation of a breakdown voltage structure for obtaining stable high breakdown voltages has been demanded. As such a breakdown voltage structure, a junction termination extension (JTE) structure is known that is formed by arranging in an edge termination region, a $p^-$-type low-concentration region having an impurity concentration lower than that of a p-type high-concentration region that forms a pn junction with an $n^-$-type drift layer. The $p^-$-type low-concentration region is arranged adjacently to an outer side (side toward a chip edge) of the p-type high-concentration region. The edge termination region is a region that surrounds a periphery of an active region. The edge termination region mitigates electric field in the active region toward a chip front surface and sustains the breakdown voltage. The active region is a region through which current flows in an ON state.

The JTE structure is constituted by plural $p^-$-type low-concentration regions (hereinafter, electric field mitigating regions) arranged adjacently in a concentric shape surrounding the periphery of the active region, and the closer a $p^-$-type low-concentration region is arranged to the chip edge, the lower is an impurity concentration of the $p^-$-type low-concentration region. Points of electric field concentration at outer edges of the electric field mitigating regions constituting the JTE structure are distributed, whereby maximum electric field strength is reduced. As for conventional JTE structures, a structure has been proposed that includes a region (hereinafter, space-modulated region) in which between adjacent electric field mitigating regions, a p-type sub-region having an impurity concentration equal to that of an inner-side electric field mitigating layer and a p-type sub-region having an impurity concentration equal to that of an outer-side electric field mitigating layer are arranged to be adjacent and alternately repeat in a concentric shape surrounding the periphery of the active region (for example, refer to Japanese Patent No. 5554415 (paragraphs 0049, 0065, FIGS. 9, 11)).

A conventional breakdown voltage structure will be described. FIG. 10 is a cross-sectional view of an example of a conventional breakdown voltage structure. FIG. 10 corresponds to FIG. 11 in Japanese Patent No. 5554415. The left-hand side of FIG. 10 depicts regions closer toward an active region and the right-hand side depicts regions closer toward a chip edge (similarly in FIG. 11). The conventional breakdown voltage structure depicted in FIG. 10 is constituted by three electric field mitigating layers ($p^-$-type region, $p^{--}$-type region, and $p^{---}$-type region) 111, 112, 113 and three space-modulated regions 121, 122, 123, where the closer an electric field mitigating layer 111, 112, 113 is arranged to the chip edge of a silicon carbide base (semiconductor chip) 104, the lower is an impurity concentration of the electric field mitigating layer 111, 112, 113. The silicon carbide base 104 is formed by forming by epitaxial growth on a front surface of an $n^+$-type semiconductor substrate (hereinafter, $n^+$-type silicon carbide substrate: not depicted) containing silicon carbide, an $n^-$-type silicon carbide layer constituting an $n^-$-type drift layer 102.

At a boundary of the active region and the edge termination region 110, a p-type guard ring 103 is selectively provided in a surface layer on a front surface (surface on the $n^-$-type drift layer 102 side) of the silicon carbide base 104. The p-type guard ring 103 surrounds a periphery of the active region. In the edge termination region 110, the first, second, third electric field mitigating layers 111, 112, 113 in order stated from nearest the active region toward the chip edge are selectively provided in the surface layer on the front surface of the silicon carbide base 104, closer to the chip edge than is the p-type guard ring 103. The first, second, third electric field mitigating layers 111, 112, 113 are arranged in a concentric shape surrounding a periphery of the p-type guard ring 103. The first electric field mitigating layer 111 is in contact with the p-type guard ring 103. The first, second, third electric field mitigating layers 111, 112, 113 each have a uniform impurity concentration distribution.

Between the adjacent first, second, third electric field mitigating layers 111, 112, 113, the first and second space-modulated regions 121, 122 are provided, respectively. The third space-modulated region 123 is provided closer to the chip edge than is the third electric field mitigating layer 113, and is in contact with the third electric field mitigating layer 113. The first, second, third space-modulated regions 121, 122, 123 are in contact with the electric field mitigating layers 111, 112, 113 adjacent thereto. The first, second, third space-modulated regions 121, 122, 123 are constituted by p-type regions (hereinafter, high-concentration sub-regions) 131 having an impurity concentration substantially equal to the impurity concentration of the electric field mitigating layer 111, 112, 113 adjacent thereto on an inner side (side toward the active region) thereof, and p-type regions (hereinafter, low-concentration sub-regions) 132 having an impurity concentration substantially equal to the impurity concentration of the electric field mitigating layer 111, 112, 113 adjacent thereto on an outer side (side toward the chip edge) thereof (in the third space-modulated region 123, the low-concentration sub-regions 132 have an impurity concentration substantially equal to that of the $n^-$-type drift layer 102).

The low-concentration sub-regions 132 and the high-concentration sub-regions 131 are arranged to be adjacent and alternately repeat toward the chip edge, in a concentric shape surrounding a periphery of the electric field mitigating layer 111, 112, 113 adjacent thereto on the inner side thereof. In the space-modulated regions 121, 122, 123, the closer a high-concentration sub-region 131 is arranged to the chip edge, the narrower is a width (width in a direction from the inner side thereof toward the chip edge) $x_{101}$ thereof; and the closer a low-concentration sub-region 132 is arranged to the chip edge, the wider is a width (width in the direction from the inner side thereof toward the chip edge) $x_{102}$ thereof. A depletion layer that spreads from the active region, passes through regions constituting these breakdown voltage structures and spreads through the edge termination region 110 toward the chip edge. As a result, electric field in the silicon carbide base 104 becomes uniform and is mitigated, whereby the breakdown voltage is ensured. In particular, the first, second, high electric field is uniformly retained by the third space-modulated regions 121, 122, 123, enabling high breakdown voltage to be ensured.

As another breakdown voltage structure, a structure having optimized conditions for the space-modulated regions has been proposed. One set of a high-concentration sub-region and a low-concentration sub-region is regarded as one equal-concentration region and in one space-modulated region, the closer the equal-concentration region is arranged to the chip edge, the lower is an equal-concentration (average impurity concentration) thereof. A reduction rate of a ratio between the equal-concentrations of adjacent equal-concentration regions is constant. The space-modulated region is divided into plural sections that each includes one or more adjacent equal-concentration regions, where an average impurity concentration difference between adjacent sections is equal (for example, refer to International Publication No. WO 2016/103814 (paragraphs 0121 to 0127, FIG. 20)). In International Publication No. WO 2016/103814, electric field concentration at boundaries of the high-concentration sub-regions and the low-concentration sub-regions is mitigated, electric field distribution in the space-modulated region is further equalized, and the breakdown voltage is further improved.

An example of this conventional breakdown voltage structure will be described. FIG. 11 is a cross-sectional view of an example of the conventional breakdown voltage structure. FIG. 11 corresponds to FIG. 20 in International Publication No. WO 2016/103814. In the conventional breakdown voltage structure depicted in FIG. 11, a space-modulated region (here, indicated as a first space-modulated region 121) is divided into plural sections (here, 4) 141, 142, 143, 144 that each includes one or more adjacent equal-concentration regions 130 (sub-areas including one set of the high-concentration sub-region 131 and the low-concentration sub-region 132). Additionally, the closer a section 141 to 144 is arranged to the chip edge, the narrower is a width $x_{101}$ of the high-concentration sub-region 131 therein. Other than the width $x_{10}$ of the high-concentration sub-region 131 in the sections 141 to 144, configuration of the conventional breakdown voltage structure depicted in FIG. 11 is similar to the conventional breakdown voltage structure that depicted in FIG. 10.

Further, in the silicon carbide semiconductor device, to obtain stable high breakdown voltages, reduction of the maximum electric field strength in a gel that seals a semiconductor chip in a package (resin case) has been disclosed (for example, refer to Japanese Patent No. 5600698 (paragraphs 0005, 0021, FIG. 3)). In Japanese Patent No. 5600698, a surface protecting film formed on an electric field mitigating region in an edge termination region has a 2-layer structure including an inorganic layer and a resin layer, where a thickness of the resin layer, a dielectric constant difference of the inorganic layer and the resin layer, etc. are optimized, thereby reducing the maximum electric field strength in a sealant.

SUMMARY OF THE INVENTION

According to an embodiment of the invention, a silicon carbide semiconductor device includes a semiconductor substrate of a first conductivity type containing silicon carbide; an active region provided at a front surface of the semiconductor substrate and through which a main current flows; a plurality of second-conductivity-type semiconductor regions selectively provided in a concentric shape surrounding a periphery of the active region, the plurality of second-conductivity-type semiconductor regions having differing impurity concentrations that are relatively lower with increasing proximity of respective ones of the plurality of second-conductivity-type semiconductor regions to a chip edge; a plurality of first intermediate regions of a second conductivity type, each first intermediate region of the plurality of first intermediate regions being provided between and in contact with adjacent second-conductivity-type semiconductor regions of the plurality of second-conductivity-type semiconductor regions, and each first intermediate region having an impurity concentration that is lower than an impurity concentration of an adjacent second-conductivity-type semiconductor region on an inner side and that is higher than an impurity concentration of another adjacent second-conductivity-type semiconductor region on an outer side; and a second intermediate region of the second conductivity type provided closer to the chip edge than is an outermost second-conductivity-type semiconductor region that is nearest the chip edge among the plurality of second-conductivity-type semiconductor regions, the second intermediate region being in contact with the outermost second-conductivity-type semiconductor region and having an impurity concentration that is lower than the impurity concentration of the adjacent second-conductivity-type semiconductor region on an inner side and that is higher than an impurity concentration of the semiconductor substrate. The plurality of first intermediate regions and the second intermediate region are each formed by, from the inner side, a first sub-region of the second conductivity type and a second sub-region of the second conductivity type arranged to be adjacent and to alternately repeat in a concentric shape surrounding a periphery of the adjacent second-conductivity-type semiconductor region on the inner side, the second sub-region having an impurity concentration that is higher than an impurity concentration of the first sub-region. The second intermediate region has a length that is longer than respective lengths of the plurality of first intermediate regions.

In the embodiment, each first intermediate region of the plurality of first intermediate regions has a length that is at least equal to a length of an adjacent first intermediate region on the inner side thereof.

In the embodiment, each second-conductivity-type semiconductor region of the plurality of second-conductivity-type semiconductor regions has a length that is longer than a length of the adjacent second-conductivity-type semiconductor region on the inner side thereof.

In the embodiment, differences in respective lengths of adjacent second-conductivity-type semiconductor regions are all equal.

In the embodiment, the impurity concentration of the first sub-region of respective first intermediate regions of the plurality of first intermediate regions is equal to the impurity concentration of the respective another adjacent second-conductivity-type semiconductor region on the outer side.

In the embodiment, the impurity concentration of the first sub-region of the second intermediate region is equal to the impurity concentration of the semiconductor substrate.

In the embodiment, the impurity concentration of the second sub-region is equal to the impurity concentration of the adjacent second-conductivity-type semiconductor region on the inner side.

In the embodiment, the silicon carbide semiconductor device further includes a surface protecting film provided on a front surface of the semiconductor substrate, the surface protecting film covering the plurality of second-conductivity-type semiconductor regions, the plurality of first intermediate regions and the second intermediate region. The surface protecting film has a thickness that is at least a maximum thickness that is formable by a single session of an application process, based on viscosity of a material used in forming the surface protecting film.

According to another embodiment, a silicon carbide semiconductor device includes a semiconductor substrate of a first conductivity type and containing silicon carbide; an active region provided at a front surface of the semiconductor substrate and through which a main current flows; a plurality of second-conductivity-type semiconductor regions selectively provided in a concentric shape surrounding a periphery of the active region, the plurality of second-conductivity-type semiconductor regions having differing impurity concentrations that are relatively lower with increasing proximity of respective ones of the plurality of second-conductivity-type semiconductor regions to a chip edge; a plurality of first intermediate regions of a second conductivity type, each first intermediate region of the plurality of first intermediate regions being provided between and in contact with adjacent second-conductivity-type semiconductor regions of the plurality of second-conductivity-type semiconductor regions, and each first intermediate region having an impurity concentration that is lower than an impurity concentration of an adjacent second-conductivity-type semiconductor region on an inner side and that is higher than an impurity concentration of another adjacent second-conductivity-type semiconductor region on an outer side; and a second intermediate region of the second conductivity type provided closer to the chip edge than is an outermost second-conductivity-type semiconductor region that is nearest the chip edge among the plurality of second-conductivity-type semiconductor regions, the second intermediate region being in contact with the outermost second-conductivity-type semiconductor region and having an impurity concentration that is lower than the impurity concentration of the adjacent second-conductivity-type semiconductor region on an inner side and that is higher than an impurity concentration of the semiconductor substrate. The plurality of first intermediate regions and the second intermediate region are each formed by, from the inner side, a first sub-region of the second conductivity type and a second sub-region of the second conductivity type arranged to be adjacent and to alternately repeat in a concentric shape surrounding a periphery of the adjacent second-conductivity-type semiconductor region on the inner side, the second sub-region having an impurity concentration that is higher than an impurity concentration of the first sub-region. The plurality of second-conductivity-type semiconductor regions each has a length that is longer than a length of the adjacent second-conductivity-type semiconductor region on the inner side.

In the embodiment, the silicon carbide semiconductor device further includes a surface protecting film provided on the front surface of the semiconductor substrate, the surface protecting film covering the plurality of second-conductivity-type semiconductor regions, the plurality of first intermediate regions and the second intermediate region. The surface protecting film has a thickness that is at least a maximum thickness that is formable by a single session of an application process, based on viscosity of a material used in forming the surface protecting film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is an enlarged cross-sectional view of a single space-modulated region depicted in FIG. 1B;

DETAILED DESCRIPTION OF THE INVENTION

Figure 1A:
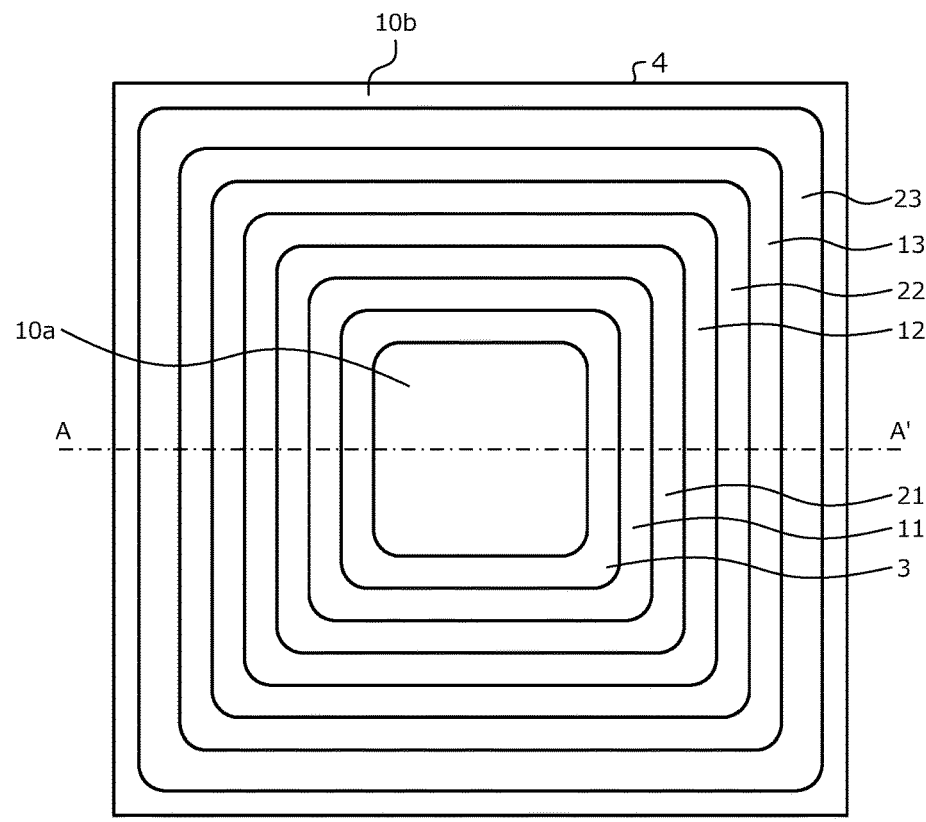
FIG. 1A is a diagram depicting a breakdown voltage structure of a semiconductor device according to an embodiment.

First, problems associated with the related arts will be described. In general, a semiconductor chip is mounted in a module package and sealed by, for example, a gel, with a front surface of the semiconductor chip being covered by a surface protecting film such as a polyimide film. Here, when a semiconductor chip (hereinafter, Si chip) containing silicon (Si) is used, a length (hereinafter, edge length) of the edge termination region is long, whereby electric field in Si chip toward the front surface is mitigated, local electrical discharge due to electric field concentration, etc. does not occur. The edge length is a length from a boundary the active region and the edge termination region 110 to the chip edge.

Nonetheless, when a semiconductor chip (hereinafter, SiC chip) containing silicon carbide is used, application of the conventional breakdown voltage structures (refer to FIGS. 10, 11) enables the edge length to be reduced. However, problem arises in that electric field strength on a front surface (surface of the surface protecting film) of the SiC chip increases. Therefore, at the surface of the surface protecting film (not depicted) in the SiC chip alone or at an interface of the gel and the surface protecting film when the SiC chip is sealed by the gel or the like, electrical discharge occurs and dielectric breakdown may occur at the surface protecting film on the front surface of the SiC chip, rather than inside the SiC chip.

As a measure to circumvent this problem, the edge length of the SiC chip may be increased to be about equal to the edge length of the Si chip. However, as described above, with the SiC chip, a predetermined breakdown voltage may be obtained at a shorter edge length as compared to the Si chip. Therefore, increasing the edge length of the SiC chip to be about equal to the edge length of the Si chip to obtain the predetermined breakdown voltage increases the amount of chip area that is useless. Therefore, from the perspective of breakdown voltage, a new problem arises in that the size of the SiC chip increases.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1B:
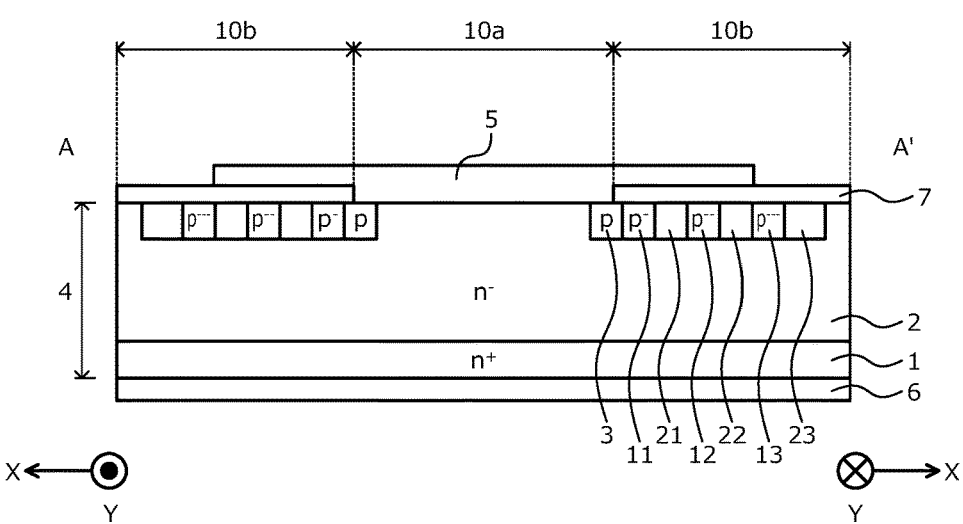
FIG. 1B is a diagram depicting the breakdown voltage structure of the semiconductor device according to the embodiment.
Figure 3:
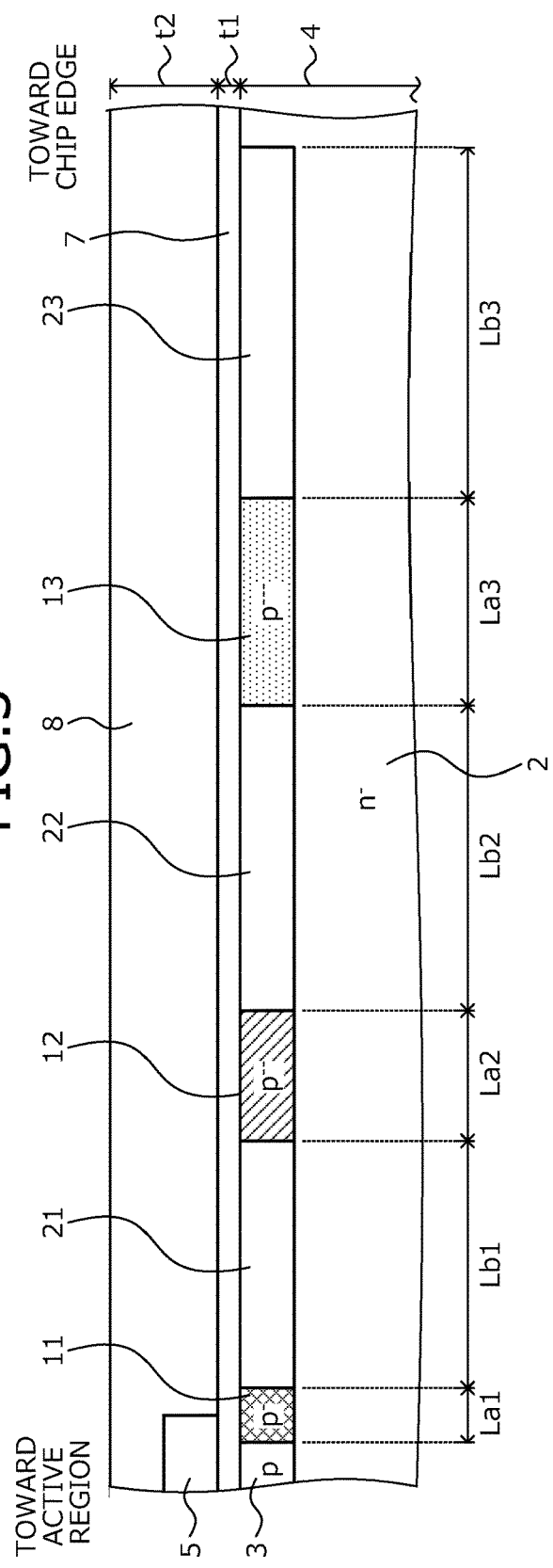
FIG. 3 is an enlarged cross-sectional view of the breakdown voltage structure in FIG. 1B.

A structure of the silicon carbide semiconductor device according to an embodiment will be described. FIGS. 1A and 1B are diagrams depicting a breakdown voltage structure of a semiconductor device according to the embodiment. FIG. 1A depicts a planar layout and FIG. 1B depicts a cross-sectional view of the structure along cutting line A-A' in FIG. 1A. In FIGS. 1A and 1B, to clearly show an overall layout of the breakdown voltage structure, regions constituting the breakdown voltage structure are not depicted. The planar layout is a planar shape and an arrangement configuration of constituent regions as viewed from a front surface of a silicon carbide base 4. FIG. 2 is an enlarged cross-sectional view of a single space-modulated region depicted in FIG. 1B. FIG. 3 is an enlarged cross-sectional view of a breakdown voltage structure in FIG. 1B.

As depicted in FIG. 1, the semiconductor device according to the embodiment includes a silicon carbide base (semiconductor chip (semiconductor substrate)) 4 having an active region 10a and an edge termination region 10b. The silicon carbide base 4 epitaxial substrate formed by forming epitaxial growth on a front surface of an n$^+$-type semiconductor substrate (n$^+$-type silicon carbide substrate) 1 containing silicon carbide (SiC), an n$^−$-type silicon carbide layer 2 constituting an n$^−$-type drift layer. The active region 10a is a region through which current flows in the ON state. The edge termination region 10b is a region that surrounds a periphery of the active region 10a, and mitigates electric field toward a chip front surface in the active region 10a.

In the active region 10a, a predetermined element structure (not depicted) is provided such as a Schottky barrier diode (SBD), a metal oxide semiconductor field effect transistor (MOSFET), an insulated gate bipolar transistor (IGBT), etc. Reference numerals 5, 6 are respectively a front electrode and a rear electrode constituting the predetermined element structure.

In the active region 10a, on a front surface of the silicon carbide base 4, the front electrode 5 is provided and is in contact with the n$^−$-type silicon carbide layer 2. The front electrode 5 is further in contact with a p-type guard ring 3 described hereinafter. The front electrode 5 may extend onto a field oxide film 7 described hereinafter. On a rear surface of the silicon carbide base 4, the rear electrode 6 is provided spanning from the active region 10a, across the edge termination region 10b. The field oxide film 7 covers the front surface of the silicon carbide base 4 in the edge termination region 10b. A thickness t1 of the field oxide film 7 may be in a range from 0.3 μm to 1.0 μm. On the front electrode 5 and the field oxide film 7, a surface protecting film 8 (refer to FIG. 3) such as a polyimide film is provided.

The field oxide film 7 covers a later described JTE structure of the edge termination region 10b and electrically insulates the JTE structure and the front electrode 5. An end of the field oxide film 7 toward the active region 10a may extend onto the p-type guard ring 3. In FIG. 1, for example, a SBD is depicted. In this case, the front electrode 5 is an anode electrode and the rear electrode 6 is a cathode electrode. The front electrode 5 is provided on the front surface of the silicon carbide base 4, forms a Schottky junction with the n$^−$-type drift layer (n$^−$-type silicon carbide layer 2), and is in contact with the p-type guard ring 3. The p-type guard ring 3 surrounds a periphery of the Schottky junction between the n$^−$-type drift layer and the front electrode 5.

At a boundary of the active region 10a and the edge termination region 10b, in a surface layer on the front surface of the silicon carbide base 4, the p-type guard ring 3 is selectively provided so as to surround the periphery of the active region 10a. The p-type guard ring 3 is provided spanning from the active region 10a into the edge termination region 10b. Further, in the edge termination region 10b, first, second, third electric field mitigating layers (second-conductivity-type semiconductor regions: a p$^−$-type region, a p$^{−−}$-type region, and a p$^{−−−}$-type region) 11, 12, 13 sequentially in order from nearest the active region 10a toward a chip edge (edge of the semiconductor chip) are each selectively provided in the surface layer on the front surface of the silicon carbide base 4, closer to the chip edge than is the p-type guard ring 3.

The first, second, third electric field mitigating layers 11, 12, 13 are arranged in a concentric shape surrounding a periphery of the p-type guard ring 3. The first electric field mitigating layer 11 is in contact with the p-type guard ring 3. An impurity concentration of the first electric field mitigating layer 11 is lower than an impurity concentration of the p-type guard ring 3. The closer the first, second, third electric field mitigating layer 11, 12, 13 is arranged to the chip edge, the lower is an impurity concentration of the first, second, third electric field mitigating layer 11, 12, 13. The first, second, third electric field mitigating layers 11, 12, 13 have a similar (uniform) impurity concentration distribution in a direction from the active region 10a toward the chip edge and in a depth direction. Lengths (lengths in a direction from the active region 10a toward the chip edge) La1, La2, La3 of the first, second, third electric field mitigating layers 11, 12, 13 will be described hereinafter (refer to FIG. 3).

Between the first, second, third electric field mitigating layers 11, 12, 13 that are adjacent and at a position closer to the chip edge than is the third electric field mitigating layer 13, a space-modulated region (a first to third respectively assigned reference numerals 21, 22, 23 sequentially from nearest the active region 10a toward the chip edge) are provided. The first space-modulated region (first intermediate region) 21 is provided between the first electric field mitigating layer 11 and the second electric field mitigating layer 12, and is in contact with the first and second electric field mitigating layers 11, 12. The second space-modulated region (first intermediate region) 22 is provided between the second electric field mitigating layer 12 and the third electric field mitigating layer 13, and is in contact with the second and third electric field mitigating layers 12, 13. The third space-modulated region (second intermediate region) 23 is provided closer to the chip edge than is the third electric field mitigating layer 13 and is in contact with the third electric field mitigating layer 13.

Respective impurity concentrations of the first, second, third space-modulated regions 21, 22, 23 are lower than an impurity concentration of the electric field mitigating layer 11, 12, 13 adjacent thereto on an inner side (side toward the active region 10a) thereof; and are higher than the impurity concentration of the electric field mitigating layer 11, 12, 13 adjacent thereto on an outer side (side toward the chip edge) thereof (the impurity concentration of the third space-modulated region 23 is higher than an impurity concentration of the type silicon carbide layer 2). The lengths (lengths in the direction from the active region 10a toward the chip edge) La1, La2, La3 of the first, second, third space-modulated regions 21, 22, 23 will be described hereinafter (refer to FIG. 3). Depths of the first, second, third electric field mitigating layers 11, 12, 13 and of the first, second, third space-modulated regions 21, 22, 23 may be equal, and may be variously adjusted so as to satisfy the above impurity concentration difference between adjacent regions. The first, second, third electric field mitigating layers 11, 12, 13 and the first, second, third space-modulated regions 21, 22, 23 constitute the breakdown voltage structure (JTE structure).

As depicted in FIG. 2, the first, second, third space-modulated regions 21, 22, 23 are each constituted by p-type regions (hereinafter, high-concentration sub-regions (second sub-regions)) 31 having an impurity concentration substantially equal to the impurity concentration of the electric field mitigating layer 11, 12, 13 adjacent thereto on the inner side thereof, and p-type regions (hereinafter, low-concentration sub-regions (first sub-regions)) 32 having an impurity concentration substantially equal to the impurity concentration of the electric field mitigating layer 11, 12, 13 adjacent thereto on the outer side thereof (the impurity concentration of the third space-modulated region 23 is substantially equal to the impurity concentration of the n$^-$-type silicon carbide layer 2). The left-hand side of FIG. 2 depicts regions closer toward the active region 10a (inner side) and the right-hand side of FIG. 2 depicts regions closer toward the chip edge (outer side) (similarly in FIGS. 3 and 4). FIG. 2 depicts the first space-modulated region 21. Further, in FIG. 2, the field oxide film 7 and the surface protecting film 8 are not depicted.

The high-concentration sub-regions 31 and the low-concentration sub-regions 32 are arranged to be adjacent and alternately repeat toward the chip edge, in a concentric shape surrounding a periphery of the electric field mitigating layer 11, 12, 13 adjacent thereto on the inner side thereof. In particular, at an innermost side (side nearest the active region 10a) of the space-modulated region 21, 22, 23, the low-concentration sub-region 32 is arranged so as to be in contact with the electric field mitigating layer 11, 12, 13 on the inner side of the space-modulated region 21, 22, 23 (for example, in the case of the first space-modulated region 21, the first electric field mitigating layer 11); and at an outermost side (side nearest the chip edge) of the space-modulated region 21, 22, 23, the high-concentration sub-region 31 is provided so as to be in contact with the electric field mitigating layer 21, 22, 23 on the outer side of the space-modulated region 21, 22, 23 (for example, in the case of the first space-modulated region 21, the second electric field mitigating layer 12). In the third space-modulated region 23, similarly to the conventional breakdown voltage structure (refer to FIG. 10), in place of the low-concentration sub-region 32, the n$^-$-type silicon carbide layer 2 is arranged.

In a single set of a high-concentration sub-region 31 and an adjacent low-concentration sub-region 32, a width (width in a direction from the inner side toward the chip edge) and the impurity concentration of the high-concentration sub-region 31 are assumed to be $x_1$ and $n_{p1}$, respectively, while a width (width in the direction from the inner side toward the chip edge) and the impurity concentration of the low-concentration sub-region 32 are assumed to be $x_2$ and $n_{p2}$, respectively. In this case, in the space-modulated region 21, 22, 23, an average impurity concentration $N_p$ of a single equal-concentration region 30 that includes a single set of the high-concentration sub-region 31 and the adjacent low-concentration sub-region 32 is expressed by equation (1). Further, the space-modulated region 21, 22, 23 may be assumed to be constituted by plural equal-concentration regions 30 arranged adjacently in a direction from the inner side of the space-modulated region 21, 22, 23 toward the chip edge.

$$N_p=((x_1\times n_{p1})+(x_2\times n_{p2}))/(x_1+x_2) \qquad (1)$$

The widths $x_1$, $x_2$ of the high-concentration sub-region 31 and the low-concentration sub-region 32 may be variously changed and based on the widths $x_1$, $x_2$, the average impurity concentration $N_p$ of the equal-concentration regions 30 is set, whereby an impurity concentration distribution of the space-modulated region 21, 22, 23, in the direction from the inner side thereof toward the chip edge may be variously changed. For example, the impurity concentration distribution of the space-modulated region 21, 22, 23 may approach an impurity concentration distribution substantially equivalent to an impurity concentration distribution that gradually decreases from the inner side of the space-modulated region 21, 22, 23 toward the chip edge. In FIG. 2, regions (the first electric field mitigating layer 11 and the high-concentration sub-region 31, the second electric field mitigating layer 12 and the low-concentration sub-region 32) having substantially equal impurity concentrations are indicated by similar hatching patterns.

An average impurity concentration per unit area of the first, second, third space-modulated regions 21, 22, 23, for example, is an intermediate impurity concentration between the electric field mitigating layer 11, 12, 13 adjacent thereto on the inner side thereof, and the electric field mitigating layer 11, 12, 13 adjacent thereto on the outer side thereof (for the third space-modulated region 23, the n$^-$-type silicon carbide layer 2 adjacent thereto on the outer side thereof). Further, provided the impurity concentration condition above and conditions of the lengths Lb1, Lb2, Lb3 of the first, second, third space-modulated regions 21, 22, 23 are satisfied, the first, second, third space-modulated regions 21, 22, 23 may be variously changed such as in the widths $x_1$, $x_2$ of the high-concentration sub-region 31 and the low-concentration sub-region 32, the number of alternating repetitions of the high-concentration sub-region 31 and the low-concentration sub-region 32 (hereinafter, repeating pitch count), etc. according to design conditions.

Figure 10:
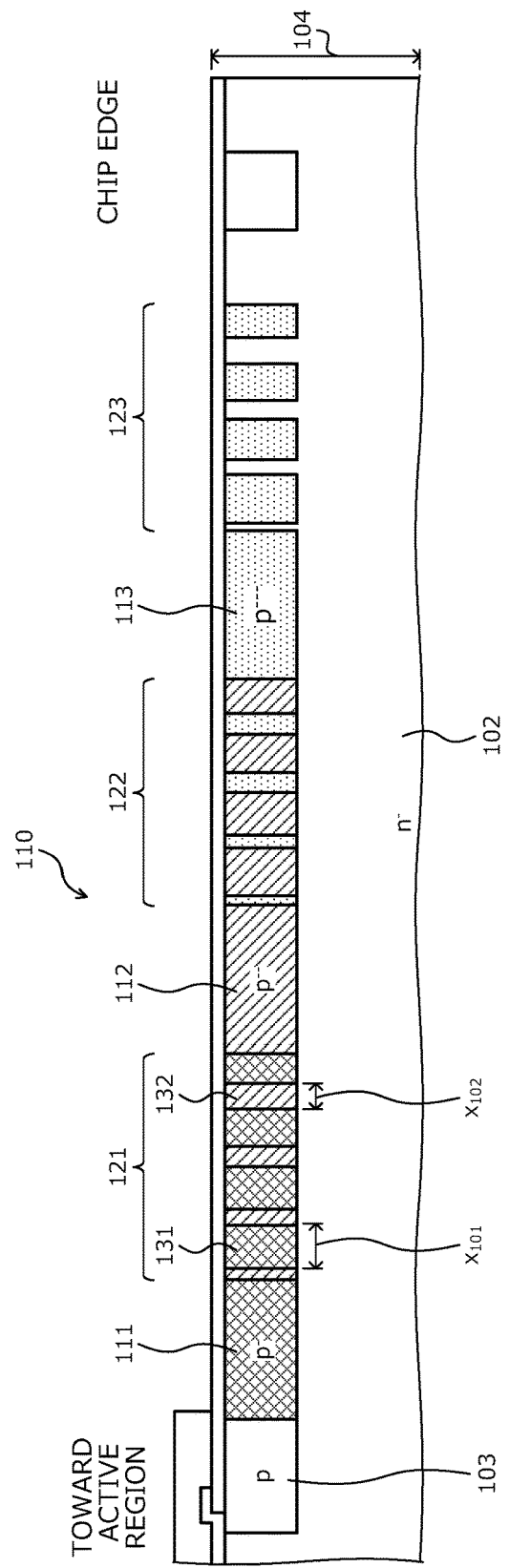
FIG. 10 is a cross-sectional view of an example of a conventional breakdown voltage structure.
Figure 11:
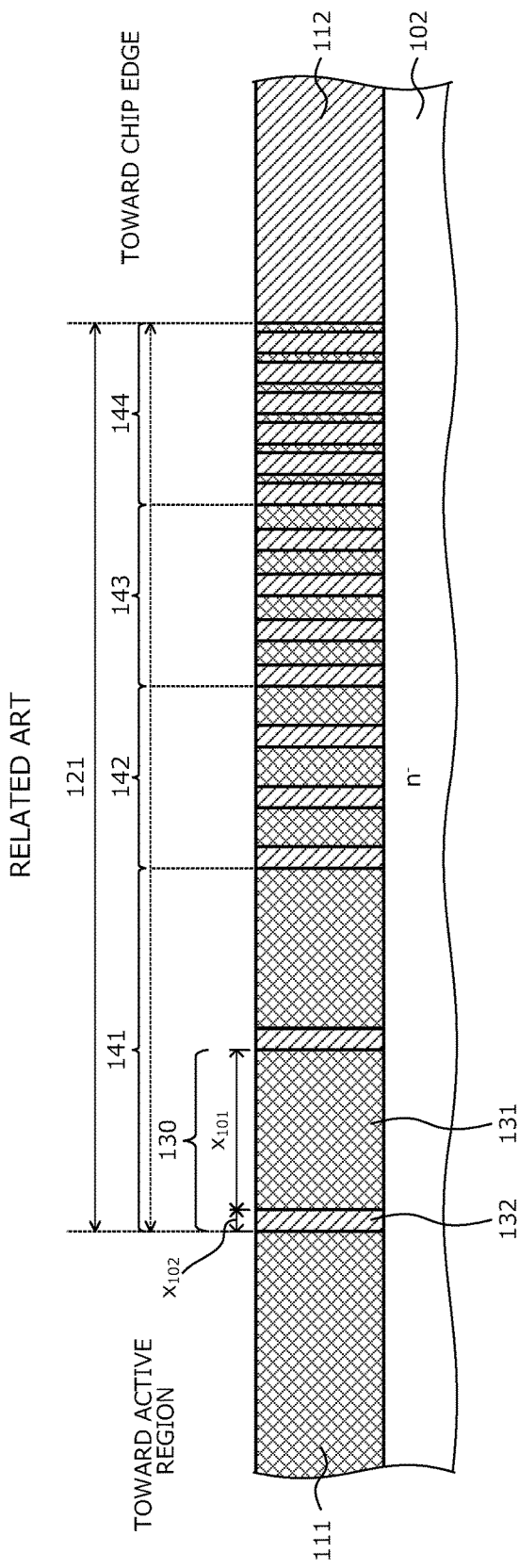
FIG. 11 is a cross-sectional view of an example of the conventional breakdown voltage structure.

The widths $x_1$, $x_2$ the high-concentration sub-region 31 and the low-concentration sub-region 32, for example, may be similar to widths in the conventional breakdown voltage structures depicted in FIGS. 10 and 11 (hereinafter, simply, the conventional breakdown voltage structure). In particular, for example, the closer the high-concentration sub-region 31 is arranged to the chip edge, the narrower is the width $x_1$; and the closer the low-concentration sub-region 32 is arranged to the chip edge, the wider is the width $x_2$. Further, a single set of a high-concentration sub-region 31 and an adjacent low-concentration sub-region 32 is assumed to be a single equal-concentration region and in a single space-modulated region 21, 22, 23, the closer the equal-concentration region is arranged to the chip edge, the lower is the equal-concentration (average impurity concentration) thereof. In addition, a reduction rate of a ratio between the equal-concentrations of adjacent equal-concentration regions may be constant; the space-modulated region 21, 22, 23 may be divided into plural sections that each includes one or more adjacent equal-concentration regions; and the average impurity concentration difference between adjacent sections may be equal.

The lengths La1, La2, La3 of the first, second, third electric field mitigating layers 11, 12, 13, and lengths Lb1, Lb2, Lb3 of the first, second, third space-modulated regions 21, 22, 23 will be described with reference to FIG. 3. A length (edge length) of the edge termination region 10b is set to be a shortest length that enables the breakdown voltage, which is determined by the maximum electric field strength in a silicon carbide part (in the silicon carbide base 4), to be ensured at a predetermined breakdown voltage, and is about equal to the edge length in the conventional breakdown voltage structure. The edge length is a length from the boundary of the active region 10a and the edge termination region 10b to the chip edge. The lengths La1, La2, La3 of the first, second, third electric field mitigating layers 11, 12, 13, and the lengths Lb1, Lb2, Lb3 of the first, second, third space-modulated regions 21, 22, 23 are determined according to the edge length. The closer the first, second, third electric field mitigating layers 11, 12, 13 are arranged to the chip edge, the longer the lengths La1, La2, La3 may be (refer to expression (2)).

$$La1 < La2 < La3 \qquad (2)$$

The length Lb3 of the third space-modulated region 23 is longer than the lengths Lb1, Lb2 of the first and second space-modulated regions 21, 22. The closer the first, second, third space-modulated regions 21, 22, 23 are arranged to the chip edge, the longer the lengths Lb1, Lb2, Lb3 may be (refer to expression (3)). The lengths Lb1, Lb2 of the first and second space-modulated regions 21, 22 may be equal (refer to expression (4)). The lengths Lb1, Lb2, Lb3 of the first, second, third space-modulated regions 21, 22, 23 are longer than the lengths La1, La2, La3 of the first, second, third electric field mitigating layers 11, 12, 13 (La1<La2<La3<Lb1 and, expression (3) or expression (4)). For example, the length La3 of the third electric field mitigating layer 13 may be about ⅙ to 1/10 of the length L3 of the third space-modulated region 23.

$$Lb1 < Lb2 < Lb3 \qquad (3)$$

$$Lb1 \leq Lb2 < Lb3 \qquad (4)$$

By forming the breakdown voltage structure to satisfy at least expression (2) or expression (4), electric field applied to the surface protecting film 8 on the front surface of the silicon carbide base 4 may be made uniform, while the electric field strength in the silicon carbide base 4 is set to be about equal to that in the conventional breakdown voltage structure and the breakdown voltage is maintained. As a result, the electric field strength at the surface of the surface protecting film 8 in the SiC chip (the silicon carbide base 4) alone, or at the interface of the gel and the surface protecting film 8 when the SiC chip is sealed by the gel or the like may be reduced (refer to FIGS. 5 and 6 described hereinafter). Therefore, breakdown voltage and an edge length about equal to those in the conventional breakdown voltage structure are maintained, and the occurrence of electrical discharge at the surface of the surface protecting film 8 and/or at the interface of the surface protecting film 8 and the gel may be suppressed.

For example, the edge length is a length that is 10 to 11 times a minimum required thickness of the n⁻-type drift layer, based on the device breakdown voltage. Further, the length La3 of the third electric field mitigating layer 13 is about 40% of the edge length. Although not particularly limited hereto, for example, when the semiconductor device according to the embodiment has a breakdown voltage of 1700V, the edge length is about 180 μm; the length La3 of the third electric field mitigating layer 13 is about 5 μm; and the length L3 of the third space-modulated region 23 is about 45 μm. When the semiconductor device according to the embodiment has a breakdown voltage of 3300V, the edge length is about 310 μm; the length La3 of the third electric field mitigating layer 13 is about 7 μm; and the length L3 of the third space-modulated region 23 is about 90 μm. In this manner, with increases in the breakdown voltage, the length of the edge termination region 10b is increased and a ratio of the length L3 of the third space-modulated region 23 with respect to the length of the edge termination region 10b is increased.

In configuring the breakdown voltage structure of the embodiment, for example, the respective lengths La1, La2, La3, Lb1, Lb2, Lb3 of the first, second, third electric field mitigating layers 11, 12, 13 and the first, second, third space-modulated regions 21, 22, 23 are set to at least satisfy expression (2) or expression (4). Increases and decreases of the widths $x_1$, $x_2$ of the high-concentration sub-region 31 and the low-concentration sub-region 32 are the same for the first, second, third space-modulated regions 21, 22, 23; and the repeating pitch count of the high-concentration sub-region 31 and the low-concentration sub-region 32 is set so that the respective lengths Lb1, Lb2, Lb3 thereof are satisfied. Therefore, the breakdown voltage structure of the embodiment may be formed by merely changing, at a formation process of the conventional breakdown voltage structure, the patterning of ion implantation masks for forming the high-concentration sub-regions 31 and the low-concentration sub-regions 32 of the first, second, third space-modulated regions 21, 22, 23 and the first, second, third electric field mitigating layers 11, 12, 13.

Figure 4:
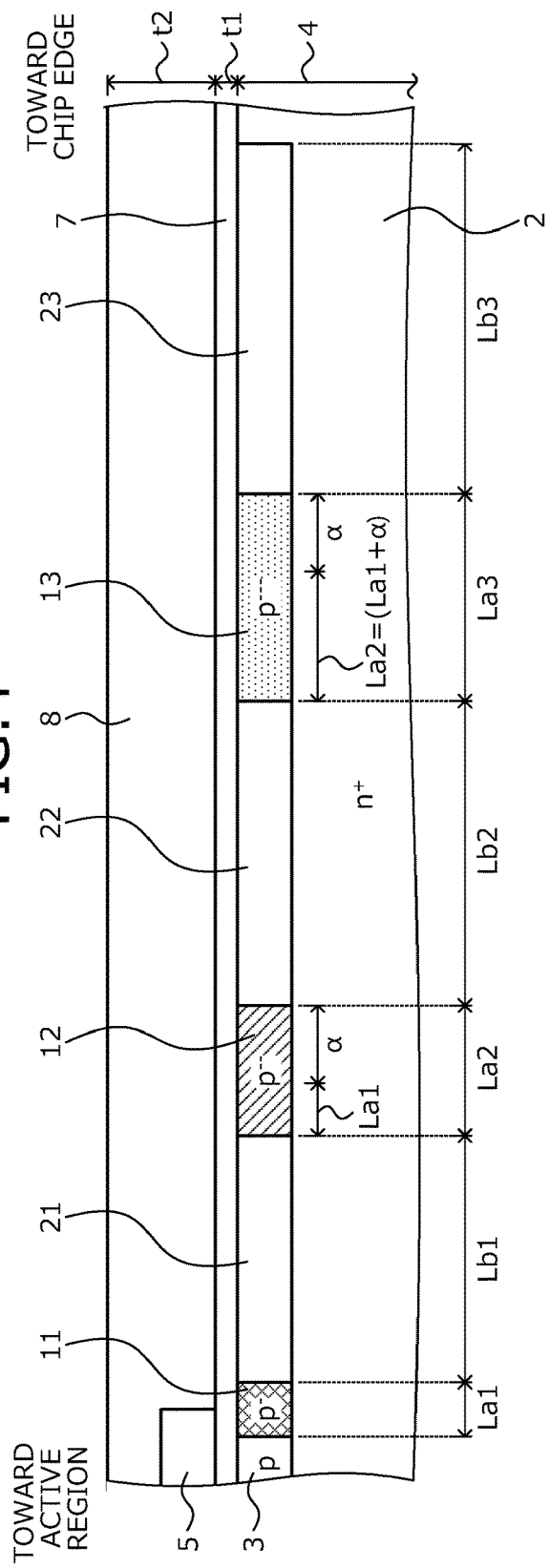
FIG. 4 is an enlarged cross-sectional view of another example of the breakdown voltage structure depicted in FIG. 1B.

FIG. 4 is an enlarged cross-sectional view of another example of the breakdown voltage structure depicted in FIG. 1B. As depicted in FIG. 4, the first, second, third electric field mitigating layers 11, 12, 13 satisfy expression (2) and with increasing proximity to the chip edge, the lengths La1, La2, La3 may be increased by a constant rate α (refer to equation (5)). In other words, differences (=rates α of increase) of the lengths La1, La2, La3 between adjacent first, second, third electric field mitigating layers 11, 12, 13 are equal. By satisfying equation (5), the electric field strength at the surface of the surface protecting film 8 in the SiC chip (the silicon carbide base 4) alone, or at the interface of the gel and the surface protecting film 8 when the SiC chip is sealed by the gel or the like may be reduced (refer to FIGS. 7 and 8 described hereinafter).

$$La2 = La1 + \alpha, \text{ and } La3 = La1 + 2 \cdot \alpha = La2 + \alpha \qquad (5)$$

Further, within the predetermined edge length, at least expression (2) or expression (4) is satisfied, and the lengths La1, La2, La3 of the first, second, third electric field mitigating layers 11, 12, 13 may be as short as possible while the lengths Lb1, Lb2, Lb3 of the first, second, third space-modulated regions 21, 22, 23 may be as long as possible. A reason for this is that by increasing the lengths Lb1, Lb2, Lb3 of the first, second, third space-modulated regions 21, 22, 23, the effect of reducing the electric field strength at the surface of the surface protecting film 8 may be enhanced as compared to increasing the lengths La1, La2, La3 of the first, second, third electric field mitigating layers 11, 12, 13.

Further, the thicker a thickness t2 of the surface protecting film 8 is, the greater is a distance from the surface of the surface protecting film 8 or from the interface of the surface protecting film 8 and the gel to the front electrode 5 and therefore, the electric field strength at the surface protecting film 8 may be further suppressed, and the electrical discharge at the surface of the surface protecting film 8, or the interface of the surface protecting film 8 and the gel may be further suppressed. For example, normally, the thickness t2 of the surface protecting film 8 is set to be a thickness that may reliably prevent an intrusion of water from outside the semiconductor device, the thickness t2 being set based on a maximum thickness (for example, about 10 µm) that may be realized by a single session of an application process, depending on a viscosity of a material such as, for example, polyimide used in forming the surface protecting film 8. Therefore, for example, the thickness t2 of the surface protecting film 8 may be made up to a thickness (about 20 µm) that is two times the maximum thickness of a single session of the application process by performing the application process twice using the same material.

A method of manufacturing the semiconductor device according to the embodiment will be described with reference to FIGS. 1 to 3. First, the n$^+$-type silicon carbide substrate (semiconductor wafer) 1 constituting the n$^+$-type cathode layer is prepared. Next, on the front surface of the n$^+$-type silicon carbide substrate 1, the n$^-$-type silicon carbide layer 2 constituting the n$^-$-type drift layer is formed by epitaxial growth, whereby an epitaxial wafer (the silicon carbide base 4) is fabricated. Next, by photolithography and ion implantation of a p-type impurity, at the boundary of the active region 10a and the edge termination region 10b, the p-type guard ring 3 is selectively formed in the surface layer on the front surface of the silicon carbide base 4.

Next, on the front surface of the silicon carbide base 4, an ion implantation mask having openings for a formation region of the first electric field mitigating layer 11 and formation regions of the high-concentration sub-regions 31 of the first space-modulated region 21 is formed, for example, using a resist material or a silicon dioxide film (SiO$_2$). Next, a p-type impurity is ion implanted using the ion implantation mask as a mask, whereby in the surface layer on the front surface of the silicon carbide base 4, the first electric field mitigating layer 11 and the high-concentration sub-regions 31 of the first space-modulated region 21 are each formed. At this time, other regions constituting the breakdown voltage structure are covered by the ion implantation mask and therefore, the p-type impurity is not implanted therein.

Next, the ion implantation mask is selectively removed, exposing formation regions of the second electric field mitigating layer 12, the low-concentration sub-regions 32 of the first space-modulated region 21, and the high-concentration sub-regions 31 of the second space-modulated region 22. Next, a p-type impurity is ion implanted using the ion implantation mask as a mask, whereby in the surface layer on the front surface of the silicon carbide base 4, the second electric field mitigating layer 12, the low-concentration sub-regions 32 of the first space-modulated region 21, and the high-concentration sub-regions 31 of the second space-modulated region 22 are each selectively formed. Further, in this ion implantation, impurity concentrations of other regions exposed in the openings of the ion implantation mask are increased.

Next, the ion implantation mask is selectively removed, exposing formation regions of the third electric field mitigating layer 13, the low-concentration sub-regions 32 of the second space-modulated region 22, and the high-concentration sub-regions 31 of the third space-modulated region 23. Next, a p-type impurity is ion implanted using the ion implantation mask as a mask, whereby in the surface layer on the front surface of the silicon carbide base 4, the third electric field mitigating layer 13, the low-concentration sub-regions 32 of the second space-modulated region 22, and the high-concentration sub-regions 31 of the third space-modulated region 23 are each selectively formed. Further, in this ion implantation, impurity concentrations of other regions exposed in the openings of the ion implantation mask are increased.

In this manner, in the first, second, third electric field mitigating layers 11, 12, 13, and the high-concentration sub-regions 31 and the low-concentration sub-regions 32 of the first, second, third space-modulated regions 21, 22, 23, regions having equal impurity concentrations are concurrently exposed in sequence and ion implantation of a p-type impurity is performed. In the third space-modulated region 23, the low-concentration sub-regions 32 are formed by the n$^-$-type silicon carbide layer 2 and therefore, the third space-modulated region 23 may be formed by forming only the high-concentration sub-regions 31. Thus the first, second, third electric field mitigating layers 11, 12, 13 and the first, second, third space-modulated regions 21, 22, 23 may be formed by ion implantations (three ion implantations) for forming the first, second, third electric field mitigating layers 11, 12, 13. Subsequently, the ion implantation mask is removed.

The first, second, third electric field mitigating layers 11, 12, 13, and the high-concentration sub-regions 31 and the low-concentration sub-regions 32 of the first, second, third space-modulated regions 21, 22, 23 may be formed in ascending order of impurity concentration. In this case, ion implantation for forming regions (i.e., the third electric field mitigating layer 13, the high-concentration sub-regions 31 of the third space-modulated region 23) having the lowest impurity concentration is performed in all formation regions of the first, second, third electric field mitigating layers 11, 12, 13, and the high-concentration sub-regions 31 and the low-concentration sub-regions 32 of the first, second, third space-modulated regions 21, 22, 23. Subsequent ion implantations are sequentially performed by covering with an ion implantation mask, regions previously formed and having an impurity concentration lower than the regions that are to be formed.

After formation of the breakdown voltage structure, remaining processes (for example, formation of the field oxide film 7, the surface protecting film 8, the front electrode 5, and the rear electrode 6) are performed. Thereafter, the semiconductor wafer is cut (diced) into individual chips, whereby the SBD depicted in FIGS. 1 to 3 is completed.

Figure 5:
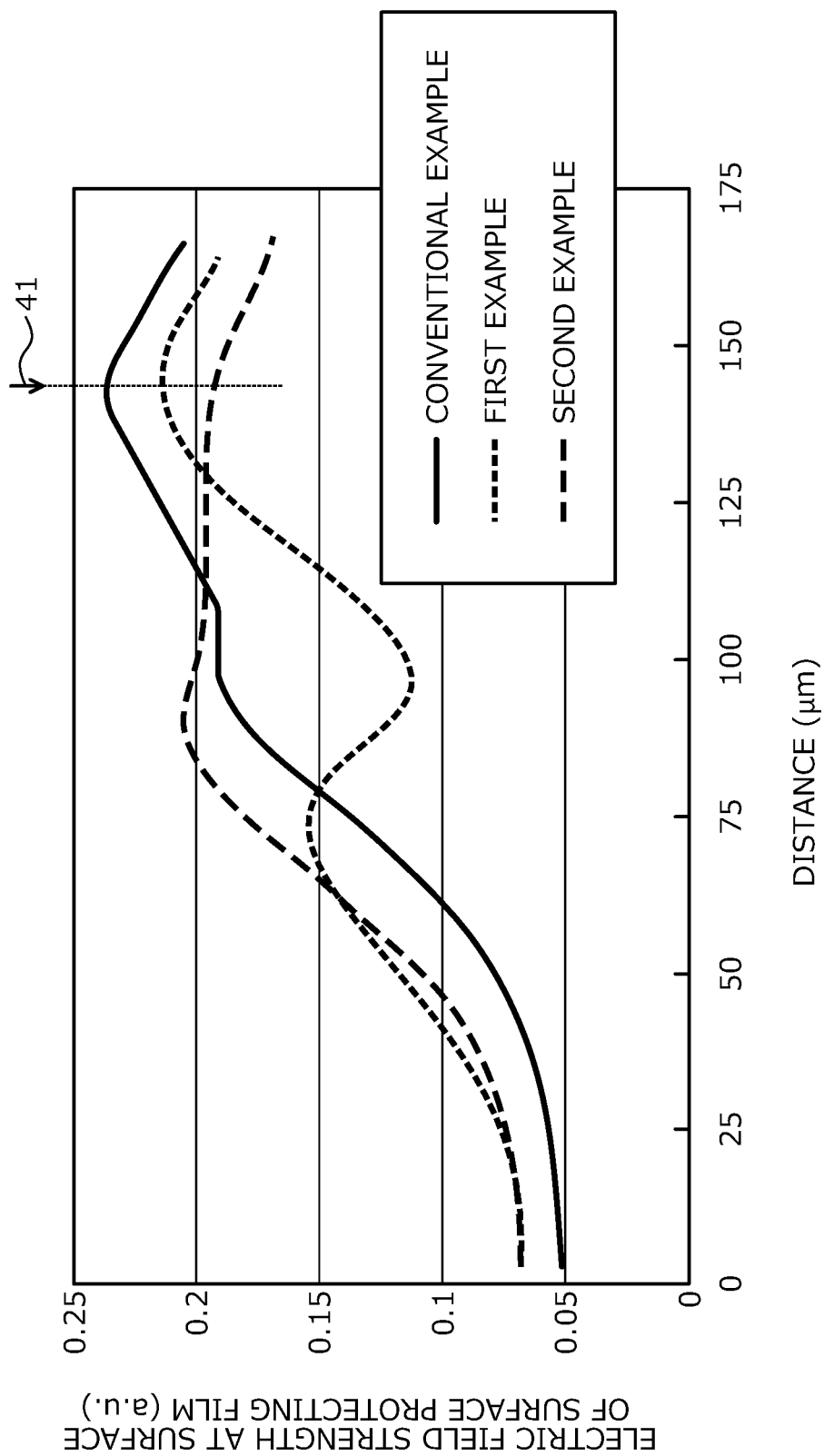
FIG. 5 is a characteristics diagram depicting electric field strength distribution at a surface of a surface protecting film in first and second examples.
Figure 6:
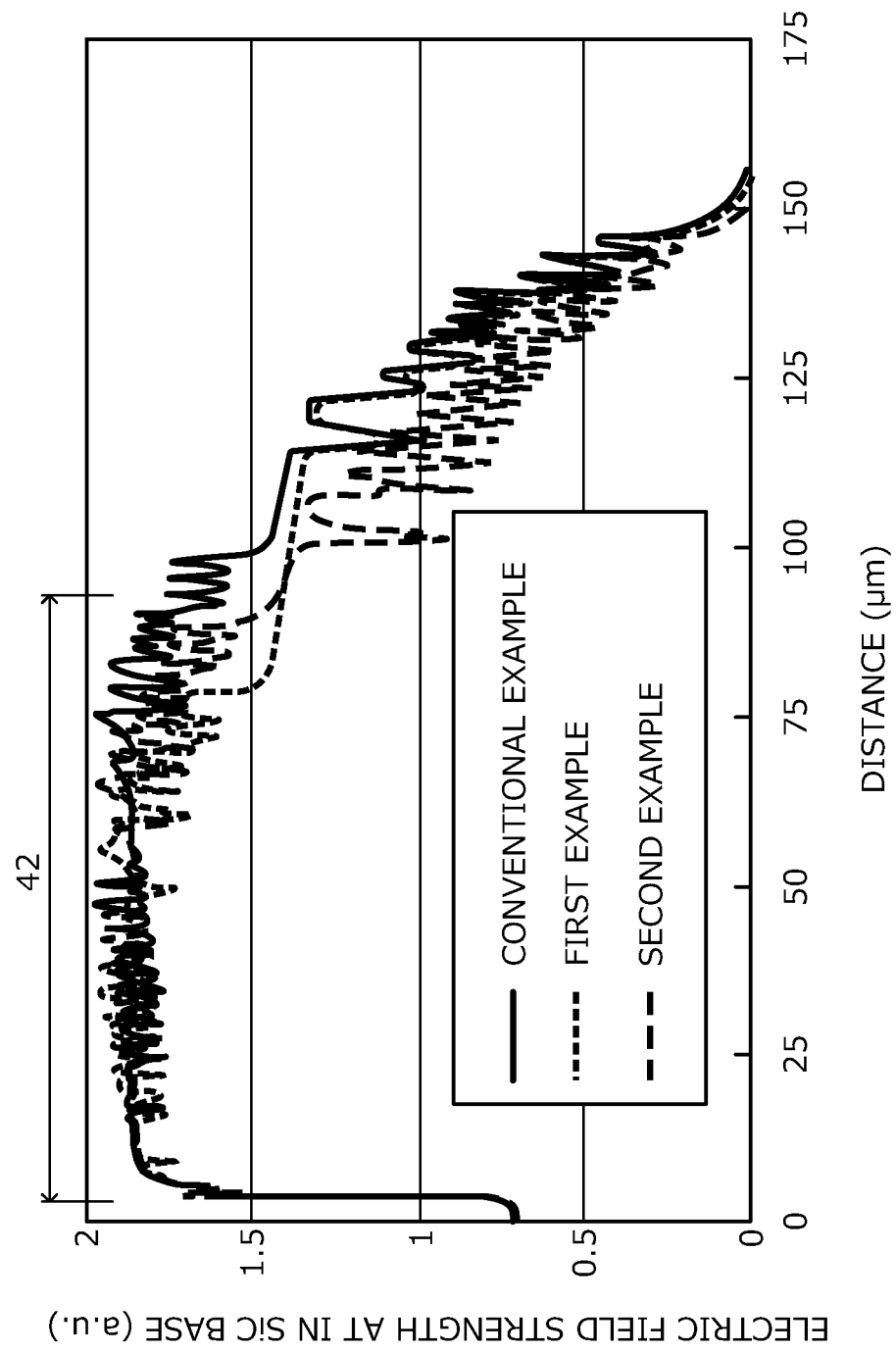
FIG. 6 is a characteristics diagram depicting electric field strength distribution in a silicon carbide base of the first and second examples.
Figure 7:
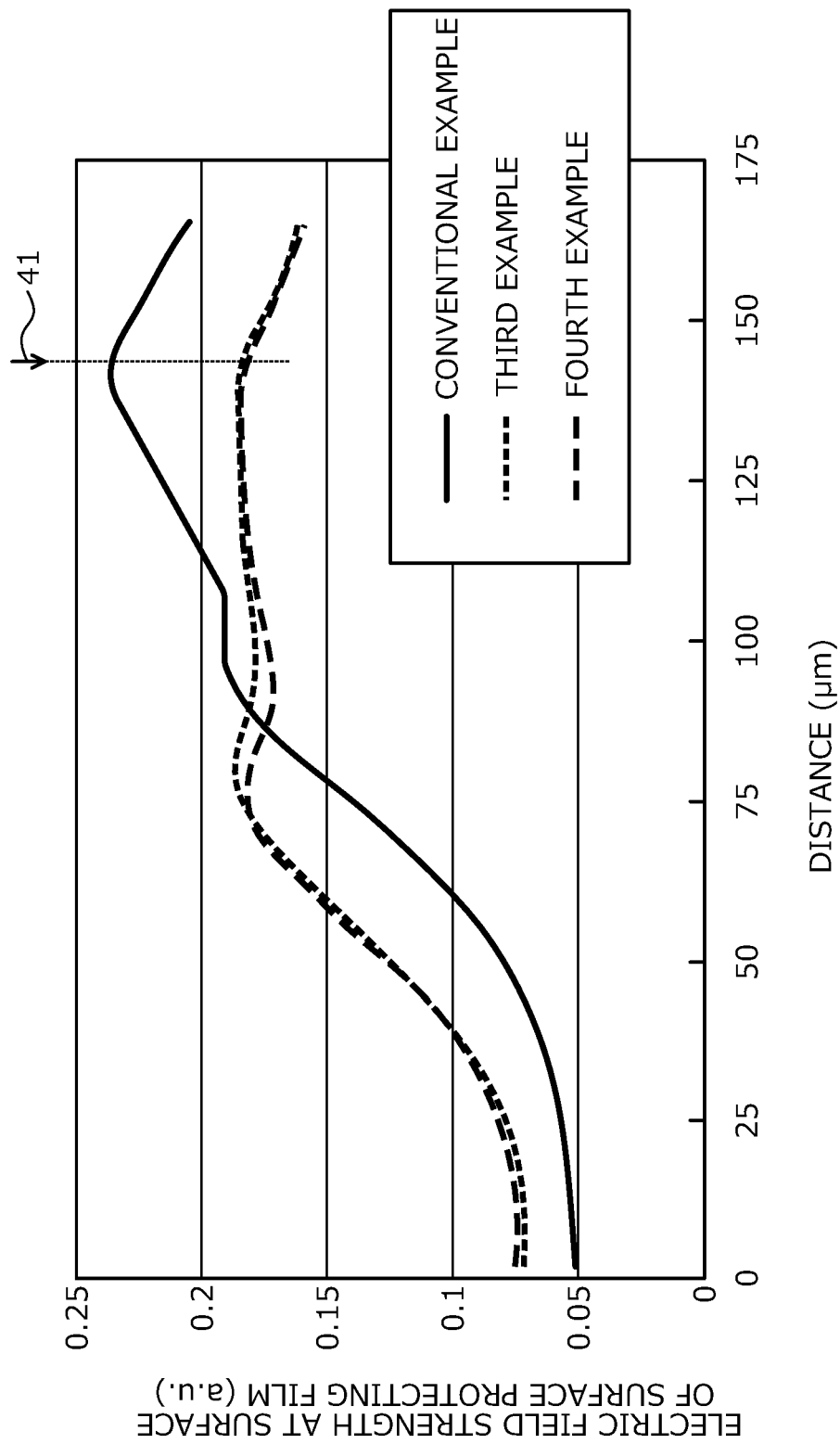
FIG. 7 is a characteristics diagram depicting electric field strength distribution at a surface of a surface protecting film in third and fourth examples.
Figure 8:
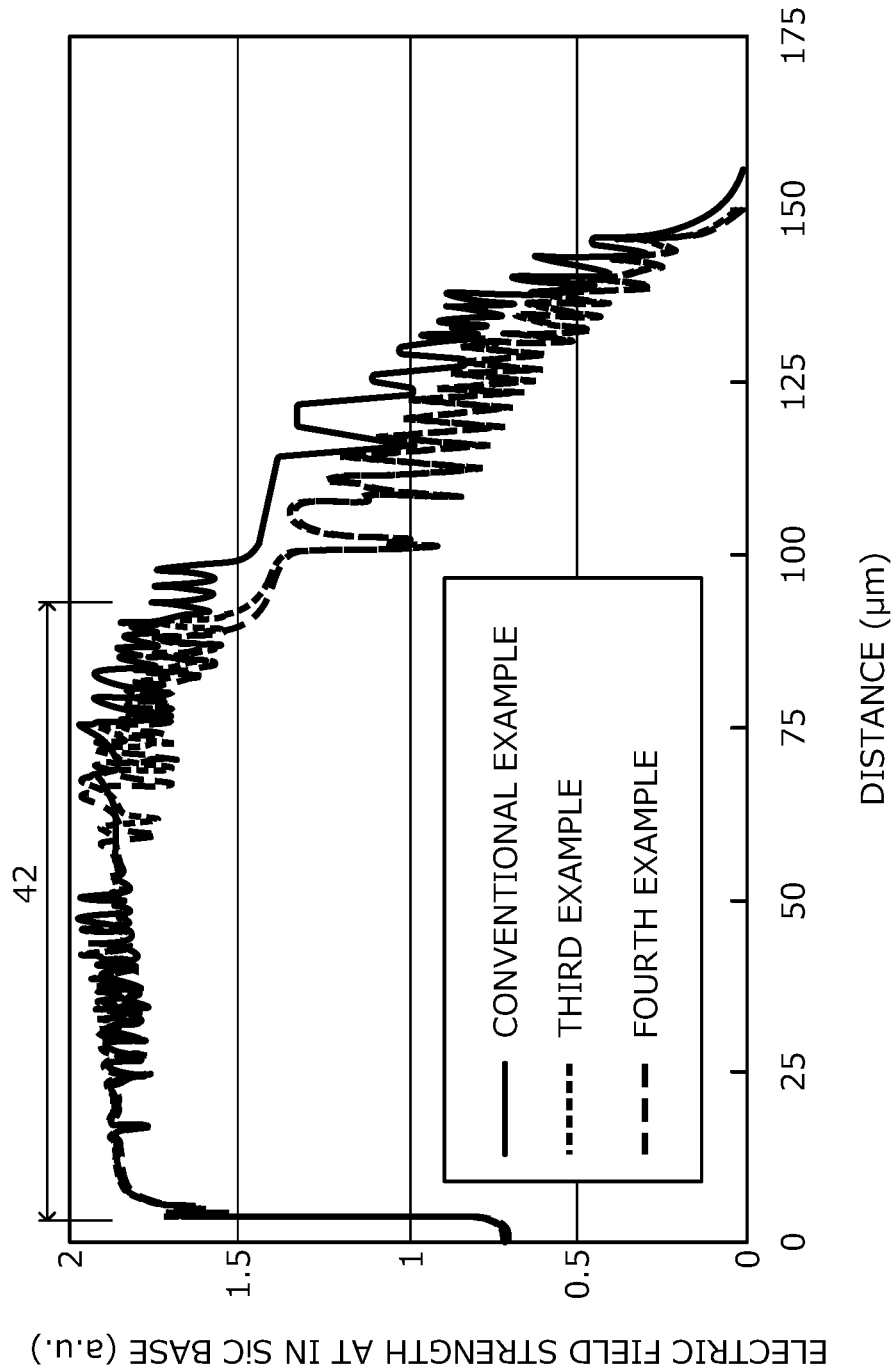
FIG. 8 is a characteristics diagram depicting electric field strength distribution in a silicon carbide base of third and fourth examples.

The electric field strength in the silicon carbide base 4 and at a front surface (opposite a rear surface of the surface protecting film 8 facing the silicon carbide base 4) of the surface protecting film 8 in the edge termination region 10b was verified. FIG. 5 is a characteristics diagram depicting electric field strength distribution at a surface of a surface protecting film in first and second examples. FIG. 6 is a characteristics diagram depicting electric field strength distribution in a silicon carbide base of the first and second examples. FIG. 7 is a characteristics diagram depicting electric field strength distribution at a surface of a surface protecting film in third and fourth examples. FIG. 8 is a characteristics diagram depicting electric field strength distribution in a silicon carbide base of third and fourth examples. FIGS. 5 and 6 further depict electric field strength distribution at a surface of a surface protecting film in a conventional example. FIGS. 7 and 8 further depict electric field strength distribution in a silicon carbide base of a conventional example.

The first, second, third, and fourth examples include the breakdown voltage structure constituted by the first, second, third electric field mitigating layers 11, 12, 13, and the first, second, third space-modulated regions 21, 22, 23. In addition, the first example satisfies the conditions of only expression (2). The second example satisfies the conditions of only expression (4). The third example satisfies the conditions of expression (2) and expression (4). The fourth example satisfies the conditions of expression (5) and expression (4). The conventional example includes the conventional breakdown voltage structure depicted in FIG. 11 described above, and satisfies none of the conditions of expressions (2) to (5). Although not depicted, in the conventional breakdown voltage structure depicted in FIG. 10 described above, the electric field strength was confirmed by the inventor to be higher than that of the conventional breakdown voltage structure depicted in FIG. 11. In the first to fourth examples and in the conventional example, configuration was similar excluding the respective lengths of the first, second, and third electric field mitigating layers and the respective lengths of the first, second, and third space-modulated regions. The edge length in the first to fourth examples and in the conventional example was 170 μm.

For the first and second examples, results of measurement of the electric field strength at the surface of the surface protecting film 8 and in the silicon carbide base 4 are depicted in FIGS. 5 and 6, respectively. For the third and fourth examples, results of measurement of the electric field strength at the surface of the surface protecting film 8 and in the silicon carbide base 4 are depicted in FIGS. 7 and 8, respectively. For the conventional example, the same results of measurement of the electric field strength at the surface of the surface protecting film are depicted in FIGS. 5 and 7 and the same results of measurement of the electric field strength in the silicon carbide base are depicted in FIGS. 6 and 8. In FIGS. 5 to 8, a horizontal axis is a distance [μm] in a direction from the boundary of the active region 10a and the edge termination region 10b (distance=0 μm) toward the chip edge and a vertical axis is the electric field strength [arbitrary unit (a.u.)] (similarly in FIG. 9).

From the results depicted in FIGS. 5 and 7, in the first to fourth examples and in the conventional example, the electric field strength at the surface of the surface protecting film was confirmed to be higher with increasing distance from the boundary of the active region 10a and the edge termination region 10b toward the chip edge. Further, from the results depicted in FIG. 5, it was confirmed that in the first and second examples, electric field strength at the surface of the surface protecting film 8 at a position 41 indicating the maximum electric field strength could be reduced for the conventional example, and it was confirmed that the electric field strength at the surface of the surface protecting film 8 could be made more uniform than in the conventional example. In other words, in the conventional example, by satisfying the conditions of expression (2) or expression (4), the electric field that concentrates at the position 41 indicating the maximum electric field strength may be distributed to be applied to the surface protecting film 8 overall.

Further, from the results depicted in FIG. 7, it was found that in a case of a breakdown voltage structure that similar to the third example, satisfies the conditions of both expression (2) and expression (4), results similar to those of the first and second examples depicted in FIG. 5 may be obtained. Further, it was confirmed that in a case of a breakdown voltage structure that similar to the fourth example, satisfies the conditions of both expression (5) and expression (4), the electric field strength at the surface of the surface protecting film 8 could be reduced more than in the third example. From the results depicted in FIGS. 6 and 8, it was confirmed that in the first to fourth examples, a location (part indicated by reference numeral 42) where the electric field strength in the silicon carbide base 4 is highest, the maximum electric field strength thereat was substantially equal to that in the conventional example. In other words, it was found that the first to fourth examples could sustain the breakdown voltage at the edge termination region 10b to a same extent as that in the conventional example.

Figure 9:
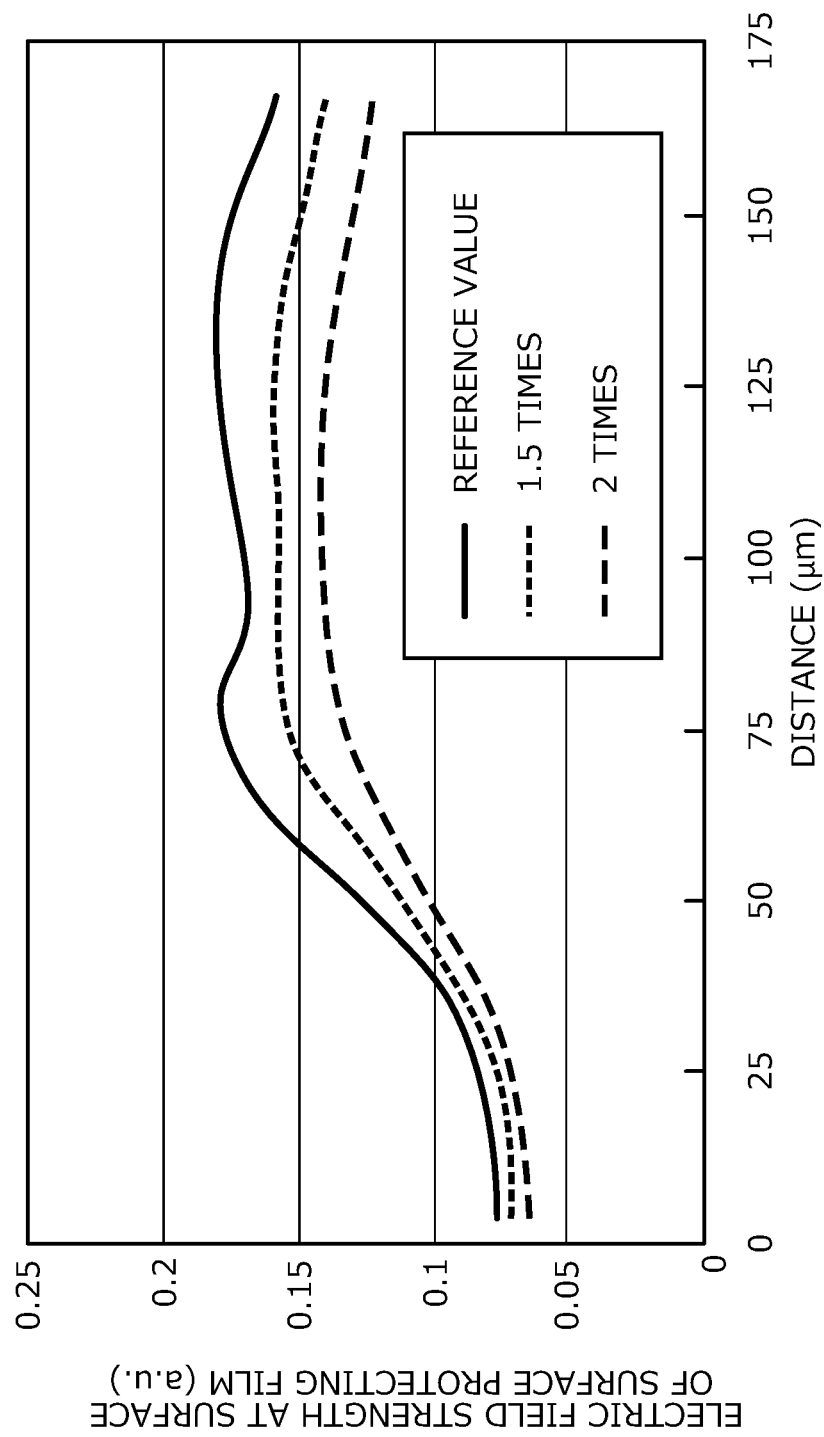
FIG. 9 is characteristics diagram depicting electric field strength distribution at a surface of a surface protecting film in a fifth example.

The thickness t2 of the surface protecting film 8 was verified. FIG. 9 is characteristics diagram depicting electric field strength distribution at the surface of the surface protecting film in a fifth example. Plural samples (hereinafter, fifth example) having differing the thicknesses t2 of the surface protecting film 8 were prepared. The breakdown voltage structures of the samples in the fifth example were similar to that of the third example. Results of measurement of the electric field strength at the surface of the surface protecting film 8 in the samples in the fifth example are depicted in FIG. 9. FIG. 9 assumes the thickness t2 of the surface protecting film 8 of one sample in the fifth example as a reference value, and depicts the electric field strength of the sample taken as the reference and the electric field strengths at the surface of the surface protecting film 8 in the samples in which the thickness t2 of the surface protecting film 8 was 1.5 times and 2 times that of the sample taking as the reference.

From the results depicted in FIG. 9, it was confirmed that the greater the thickness t2 of the surface protecting film 8 is, the greater the electric field strength at the surface of the surface protecting film 8 can be reduced.

As described, according to the embodiment, at least, the length of the electric field mitigating layer nearest the chip edge (third electric field mitigating layer) is made longer than the lengths of the other electric field mitigating layers, or the length of the space-modulated region nearest the chip edge (the third space-modulated region) is made longer than the lengths of the other space-modulated regions. As a result, with an edge length substantially equal to that in a conventional structure and with electric field mitigating layers and space-modulated regions of impurity concentrations substantially equal to those in the conventional structure, a breakdown voltage substantially equal to that in the conventional structure may be maintained while the electric field strength at the surface of the surface protecting film may be reduced to a greater extent that in the conventional structure. Therefore, in the off state, electrical discharge occurring at the surface of the surface protecting film due to voltage application (in the case of a SBD, voltage between the anode and cathode, and in the case of a MOSFET voltage between the drain and source) may be suppressed. As a result, dielectric breakdown of the surface protecting film due to electrical discharge, dielectric breakdown at the gel, and electrostatic breakdown in the silicon carbide base due to electrical discharge may be prevented, enabling device reliability to be enhanced.

Further, according to the embodiment, the low-concentration sub-regions of the space-modulated region nearest the chip edge (the third space-modulated region) are constituted by the n⁻-type silicon carbide layer (silicon carbide base), whereby variations in the average impurity concentration of the equal-concentration regions due to ion implantation variations are smaller than in other space-modulated regions. As a result, variation of the effect of reducing the electric field at the surface of the surface protecting film due to increasing the length of the space-modulated region nearest the chip edge is small.

Without limitation to the embodiments, various modifications are possible within a range not departing from the spirit of the inventions. For example, arrangement of the high-concentration sub-regions and the low-concentration sub-regions of the space-modulated regions may be optimized so as to reduce the electric field strength in the silicon carbide base. Further, in the embodiments, while a configuration (arrangement of three electric field mitigating layers and three space-modulated regions) confirmed to sufficiently ensure the breakdown voltage in the silicon carbide base and the dielectric breakdown of the surface protecting film by extensive research of the inventor has been described as an example, provided the space-modulated region nearest the chip edge is arranged, various modifications are possible such as changing the number of electric field mitigating layers and space-modulated regions.

In the embodiment, while a case in which a silicon carbide epitaxial substrate is used is described as an example, without limitation hereto, similar effects are achieved in a case where without forming an epitaxial growth layer, for example, the regions constituting the breakdown voltage structure are formed by ion implantation in a surface layer on a front surface of a silicon carbide substrate thinly cut from an ingot. Further, the present invention is similarly implemented when conductivity types (n-type, p-type) are reversed.

According to the embodiment of the silicon carbide semiconductor device according to the present invention, effects are achieved in that the edge length and the breakdown voltage are maintained while the electric field strength at the surface of the surface protecting film is reduced.

Thus, the semiconductor device according to the embodiment of the present invention is useful for high-voltage silicon carbide semiconductor devices having a JTE structure and is particularly suitable for 1200V or higher (for example, 1700V or 3300V) silicon carbide semiconductor devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate of a first conductivity type containing silicon carbide;
an active region provided at a front surface of the semiconductor substrate and through which a main current flows;
a plurality of second-conductivity-type semiconductor regions selectively provided in a concentric shape surrounding a periphery of the active region, the plurality of second-conductivity-type semiconductor regions having differing impurity concentrations that are relatively lower with increasing proximity of respective ones of the plurality of second-conductivity-type semiconductor regions to a chip edge;
a plurality of first intermediate regions of a second conductivity type, each first intermediate region of the plurality of first intermediate regions being provided between and in contact with adjacent second-conductivity-type semiconductor regions of the plurality of second-conductivity-type semiconductor regions, and each first intermediate region having an impurity concentration that is lower than an impurity concentration of an adjacent second-conductivity-type semiconductor region on an inner side and that is higher than an impurity concentration of another adjacent second-conductivity-type semiconductor region on an outer side; and
a second intermediate region of the second conductivity type provided closer to the chip edge than is an outermost second-conductivity-type semiconductor region that is nearest the chip edge among the plurality of second-conductivity-type semiconductor regions, the second intermediate region being in contact with the outermost second-conductivity-type semiconductor region and having an impurity concentration that is lower than the impurity concentration of the adjacent second-conductivity-type semiconductor region on an inner side and that is higher than an impurity concentration of the semiconductor substrate,
wherein the plurality of first intermediate regions and the second intermediate region are each formed by, from the inner side, a first sub-region of the second conductivity type and a second sub-region of the second conductivity type arranged to be adjacent and to alternately repeat in a concentric shape surrounding a periphery of the adjacent second-conductivity-type semiconductor region on the inner side, the second sub-region having an impurity concentration that is higher than an impurity concentration of the first sub-region, and
wherein the second intermediate region has a length that is longer than respective lengths of the plurality of first intermediate regions.

2. The silicon carbide semiconductor device according to claim 1, wherein each first intermediate region of the plurality of first intermediate regions has a length that is at least equal to a length of an adjacent first intermediate region on the inner side thereof.

3. The silicon carbide semiconductor device according to claim 1, wherein each second-conductivity-type semiconductor region of the plurality of second-conductivity-type semiconductor regions has a length that is longer than a length of the adjacent second-conductivity-type semiconductor region on the inner side thereof.

4. The silicon carbide semiconductor device according to claim 3, wherein differences in respective lengths of adjacent second-conductivity-type semiconductor regions are all equal.

5. The silicon carbide semiconductor device according to claim 1, wherein the impurity concentration of the first sub-region of respective first intermediate regions of the plurality of first intermediate regions is equal to the impurity concentration of the respective adjacent second-conductivity-type semiconductor region on the outer side.

6. The silicon carbide semiconductor device according to claim 1, wherein the impurity concentration of the first sub-region of the second intermediate region is equal to the impurity concentration of the semiconductor substrate.

7. The silicon carbide semiconductor device according to claim 1, wherein the impurity concentration of the second sub-region is equal to the impurity concentration of the adjacent second-conductivity-type semiconductor region on the inner side.

8. The silicon carbide semiconductor device according to claim 1, further comprising a surface protecting film provided on the front surface of the semiconductor substrate, the surface protecting film covering the plurality of second-conductivity-type semiconductor regions, the plurality of first intermediate regions and the second intermediate region, wherein the surface protecting film has a thickness that is at least a maximum thickness that is formable by a single session of an application process, based on viscosity of a material used in forming the surface protecting film.

9. A silicon carbide semiconductor device, comprising:
a semiconductor substrate of a first conductivity type containing silicon carbide;
an active region provided at a front surface of the semiconductor substrate and through which a main current flows;
a plurality of second-conductivity-type semiconductor regions selectively provided in a concentric shape surrounding a periphery of the active region, the plurality of second-conductivity-type semiconductor regions having differing impurity concentrations that are relatively lower with increasing proximity of respective ones of the plurality of second-conductivity-type semiconductor regions to a chip edge;
a plurality of first intermediate regions of a second conductivity type, each first intermediate region of the plurality of first intermediate regions being provided between and in contact with adjacent second-conductivity-type semiconductor regions of the plurality of second-conductivity-type semiconductor regions, and each first intermediate region having an impurity concentration that is lower than an impurity concentration of an adjacent second-conductivity-type semiconductor region on an inner side and that is higher than an impurity concentration of another adjacent second-conductivity-type semiconductor region on an outer side; and
a second intermediate region of the second conductivity type provided closer to the chip edge than is an outermost second-conductivity-type semiconductor region that is nearest the chip edge among the plurality of second-conductivity-type semiconductor regions, the second intermediate region being in contact with the outermost second-conductivity-type semiconductor region and having an impurity concentration that is lower than the impurity concentration of the adjacent second-conductivity-type semiconductor region on an inner side and that is higher than an impurity concentration of the semiconductor substrate, wherein the plurality of first intermediate regions and the second intermediate region are each formed by, from the inner side, a first sub-region of the second conductivity type and a second sub-region of the second conductivity type arranged to be adjacent and to alternately repeat in a concentric shape surrounding a periphery of the adjacent second-conductivity-type semiconductor region on the inner side, the second sub-region having an impurity concentration that is higher than an impurity concentration of the first sub-region, and wherein the plurality of second-conductivity-type semiconductor regions each has a length that is longer than a length of the adjacent second-conductivity-type semiconductor region on the inner side.

10. The silicon carbide semiconductor device according to claim 9, further comprising a surface protecting film provided on a front surface of the semiconductor substrate, the surface protecting film covering the plurality of second-conductivity-type semiconductor regions, the plurality of first intermediate regions and the second intermediate region, wherein the surface protecting film has a thickness that is at least a maximum thickness that is formable by a single session of an application process, based on viscosity of a material used in forming the surface protecting film.

* * * * *